United States Patent
Rolfson (12)

(10) Patent No.: US 6,548,223 B2
(45) Date of Patent: Apr. 15, 2003

(54) METHODS OF FORMING PATTERNS ACROSS PHOTORESIST AND METHODS OF FORMING RADIATION-PATTERNING TOOLS

(75) Inventor: J. Brett Rolfson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/797,352

(22) Filed: Feb. 28, 2001

(65) Prior Publication Data

US 2002/0119397 A1 Aug. 29, 2002

(51) Int. Cl.[7] .............................. G03F 7/00; G03F 7/22
(52) U.S. Cl. ...................... 430/312; 430/296; 430/313; 430/942
(58) Field of Search ................................. 430/312, 313, 430/5, 296, 394, 942, 314; 438/947

(56) References Cited

U.S. PATENT DOCUMENTS

| | | | | |
|---|---|---|---|---|
| 5,308,721 A | * | 5/1994 | Garofalo et al. | 430/313 |
| 5,308,741 A | * | 5/1994 | Kemp | 430/312 |
| 5,370,973 A | * | 12/1994 | Nishii | 430/312 |
| 5,468,595 A | * | 11/1995 | Livesay | 430/394 |
| 5,472,814 A | * | 12/1995 | Lin | 430/394 |
| 5,657,235 A | * | 8/1997 | Liebmann et al. | 250/492.22 |
| 5,753,417 A | * | 5/1998 | Ulrich | 430/312 |
| 5,789,124 A | * | 8/1998 | Todd | 430/311 |
| 6,020,107 A | * | 2/2000 | Niiyama et al. | 430/296 |
| 6,049,660 A | * | 4/2000 | Ahn et al. | 703/13 |
| 6,093,507 A | * | 7/2000 | Tzu | 430/394 |
| 6,245,492 B1 | * | 6/2001 | Huang et al. | 430/394 |
| 6,292,255 B1 | * | 9/2001 | McCullough | 355/53 |
| 6,373,071 B1 | * | 4/2002 | Innes et al. | 250/492.22 |

OTHER PUBLICATIONS

*Silicon Processing for the VLSI Era*; S. Wolf and R.N. Tauber; pp 476–483.
*Silicon Processing for the VLSI Era*; S. Wolf and R.N. Tauber; pp 407–409.
*Microlithography Science and Technology*; Pub. Marcel Dekker, Inc.; Edited by James R. Sheats & Bruce W. Smith; pp. 450–503.

* cited by examiner

Primary Examiner—Mark F. Huff
Assistant Examiner—Kripa Sagar
(74) Attorney, Agent, or Firm—Wells St. John P.S.

(57) ABSTRACT

The invention encompasses a method for forming a pattern across an expanse of photoresist. The expanse comprises a defined first region, second region and third region. The first region is exposed to a first radiation while leaving the third region not exposed; and subsequently the second region is exposed to a second radiation while leaving the third region not exposed to the second radiation. The second radiation is different from the first radiation. The exposure of the first and second regions of the expanse to the first and second radiations alters the solubility of the first and second regions in a solvent relative to the solubility of the third region of the expanse. After the first and second regions of the expanse are exposed to the first and second radiations, the expanse is exposed to a solvent to pattern the expanse. The invention can be utilized in forming radiation-patterning tools and stencils; and in pattering semiconductor substrates.

26 Claims, 6 Drawing Sheets

METHODS OF FORMING PATTERNS ACROSS PHOTORESIST AND METHODS OF FORMING RADIATION-PATTERNING TOOLS

TECHNICAL FIELD

The invention pertains to methods of forming patterns across photoresist, and in particular applications pertains to methods of forming stencils and radiation-patterning tools; and to methods of patterning semiconductor substrates.

BACKGROUND OF THE INVENTION

Photolithography is commonly used during formation of integrated circuits on semiconductor wafers. More specifically, a form of radiant energy (such as, for example, ultraviolet light) is passed through a radiation-patterning tool and onto a photoresist associated with a semiconductor wafer. The radiation-patterning tool can be, for example, a photomask or a reticle, with the term "photomask" being sometimes understood to refer to masks which define a pattern for an entirety of a wafer, and the term "reticle" being sometimes understood to refer to a patterning tool which defines a pattern for only a portion of a wafer. However, the terms "photomask" (or more generally "mask") and "reticle" are frequently used interchangeably in modern parlance, so that either term can refer to a radiation-patterning tool that encompasses either a portion or an entirety of a wafer. For purposes of interpreting this disclosure and the claims that follow, the terms "photomask" and "reticle" will be given their historical distinction such that the term "photomask" will refer to a patterning tool that defines a pattern for an entirety of a wafer, and the term "reticle" will refer to a patterning tool that defines a pattern for only a portion of a wafer.

Radiation-patterning tools contain light-restrictive regions (for example, totally opaque or attenuated/half-toned regions) and light-transmissive regions (for example, totally transparent regions) formed in a desired pattern. A grating pattern, for example, can be used to define parallel-spaced conductive lines on a semiconductor wafer. The wafer is provided with a layer of photosensitive resist material commonly referred to as photoresist. Radiation passes through the radiation-patterning tool onto the layer of photoresist and transfers the mask pattern to the photoresist. The photoresist is then developed to remove either the exposed portions of photoresist for a positive photoresist or the unexposed portions of the photoresist for a negative photoresist. The remaining patterned photoresist can then be used as a mask on the wafer during a subsequent semiconductor fabrication step, such as, for example, ion implantation or etching relative to materials on the wafer proximate the photoresist.

A method of forming a radiation-patterning tool is to provide a layer of light-restrictive material (such as, for example, chrome) over a light-transmissive substrate (such as, for example, a fused silica such as quartz), and subsequently etch a pattern into the light-restrictive material. The pattern can be etched by, for example, providing a photoresist masking material over the light-restrictive material, forming a pattern in the photoresist masking material with an electron beam or a laser beam, and transferring the pattern to the underlying light-restrictive material with an etchant that removes exposed portions of the light-restrictive material.

A typical photoresist material utilized for forming a radiation-patterning tool is chemically amplified photoresist. Such resist is particularly suitable for deep-ultraviolet (deep-UV) lithography, in that the resist can have high sensitivity. High sensitivity can be important as the light intensity of deep-UV exposure tools is typically lower than that of conventional i-line steppers.

In chemically amplified photoresist systems, a single photo-event initiates a cascade of subsequent chemical reactions. Typically, the photoresists are composed of an acid generator that produces acid upon exposure to radiation, and acid-labile compounds or polymers that have changed solubility in a developer solvent through acid-catalyzed reactions. The photoresist can be either a positive resist or a negative resist. A positive resist contains material which is initially relatively insoluble in a developer solvent, and which becomes soluble upon exposure to light-released acid; and a negative resist contains material which is initially relatively soluble in developer solvent, and which becomes insoluble upon exposure to light-released acid.

A difficulty that can occur during pattern formation with e-beam or laser writing on photoresist is that it can take several hours, and sometimes more than a day, for a pattern to be formed across an entirety of a photoresist expanse. Accordingly, a portion of a chemical-amplification photoresist expanse which is initially exposed to radiation will produce acid long before a portion of the photoresist expanse exposed to radiation at the end of the patterning process. The acid which is produced can diffuse into the photoresist expanse and cause minimum feature dimensions (i.e., critical dimensions) of initially exposed portions of the resist to be significantly larger than the minimum feature dimensions of later exposed portions of the resist. It would be desirable to develop methodologies which can alleviate or prevent such problems.

The problems described above with reference to radiation-patterning tool formation can also occur in other applications in which photoresist is sequentially exposed to radiation. For instance, in applications in which a reticle is utilized to transfer a pattern to photoresist, the reticle will be stepped across the photoresist to ultimately form the entire pattern on the photoresist. The portions of the photoresist initially exposed to light passing through the reticle can have chemical diffusion occurring therein for a longer period than the portions which are later exposed to light. Accordingly, critical dimensions associated with portions of the photoresist initially exposed to the light can be larger than the critical dimensions associated with portions of the photoresist which are later exposed to the radiation.

Additionally, methodologies have been developed wherein e-beam or laser writing technologies are utilized to form a pattern in photoresist directly over a semiconductor substrate. Such applications are similar to the above-discussed process of forming a radiation-patterning tool, except that they are utilized relative to a substrate comprising semiconductive material, rather than relative to a stack of quartz and chrome. The methodologies can suffer from the problems described above with reference to e-beam and laser writing applications for radiation-patterning tool formation.

SUMMARY OF THE INVENTION

In one aspect, the invention encompasses a method for forming a pattern across an expanse of photoresist. The expanse comprises a defined first region, second region and third region. The first region is exposed to a first radiation while leaving the third region not exposed; and subsequently the second region is exposed to a second radiation while leaving the third region not exposed to the second radiation. The second radiation is different from the first radiation. The exposure of the first and second regions of the expanse to the first and second radiations alters the solubility of the first and second regions in a solvent relative to the solubility of the third region of the expanse. After the first and second regions of the expanse are exposed to the first and second radiations, the expanse is exposed to a solvent to pattern the expanse.

In another aspect, the invention encompasses a method of forming a radiation-patterning tool. A radiation-patterning tool substrate is provided, and comprises an opaque material over a quartz plate. A layer of chemical amplification photoresist is formed over the radiation-patterning tool substrate. A first region, second region and third region are defined within the layer of photoresist. The first region is exposed to a first dose of radiation while leaving the third region not exposed to the first dose; subsequently the second region is exposed to a second dose of radiation while leaving the third region not exposed to the second dose. The second dose is different from the first dose. The exposure of the first and second regions of the photoresist to the radiation alters the solubility of the first and second regions in a solvent relative to the solubility of the third region. After the first and second regions of the layer of photoresist are exposed to the radiation, the photoresist is exposed to the solvent to pattern the layer of photoresist. Subsequently, a pattern is transferred from the photoresist to the opaque material to form a radiation-patterning tool from the radiation-patterning tool substrate.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
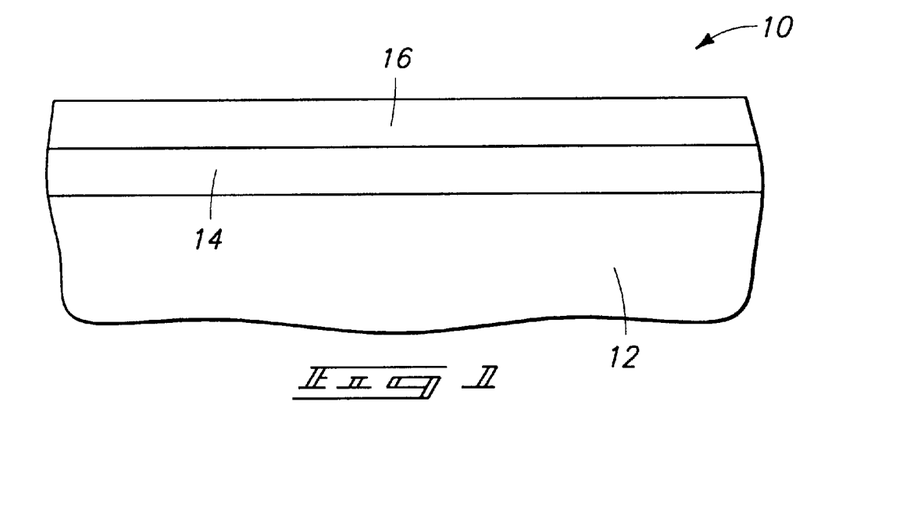
FIG. 1 is a diagrammatic, cross-sectional view of a portion of a radiation-patterning tool substrate shown at an initial step of a method of the present invention.

A first embodiment of the present invention is described with reference to FIGS. 1–8. Referring initially to FIG. 1, a portion of a radiation-patterning tool substrate 10 is shown in cross-sectional view. Substrate 10 comprises a quartz plate 12 having a layer of chrome 14 formed thereover. In the shown embodiment, chrome layer 14 is on quartz plate 12, but it is to be understood that the invention encompasses other embodiments wherein chrome layer 14 is separated from quartz plate 12 by various intervening materials.

A photoresist layer 16 is formed over chrome layer 14. In the shown embodiment, photoresist layer 16 is on chrome layer 14, but it is to be understood that the invention encompasses other embodiments wherein layer 16 is separated from chrome layer 14 by various materials, including, for example, antireflective coatings. Photoresist 16 can comprise either positive or negative photoresist, and further can comprise a chemically amplified photoresist.

Chrome layer 14 can be considered to be an opaque material provided over quartz plate 12. Ultimately, opaque material 14 is to be patterned to form a radiation-patterning tool from substrate 10. The radiation-patterning tool can be either a reticle or a photomask.

Figure 2:
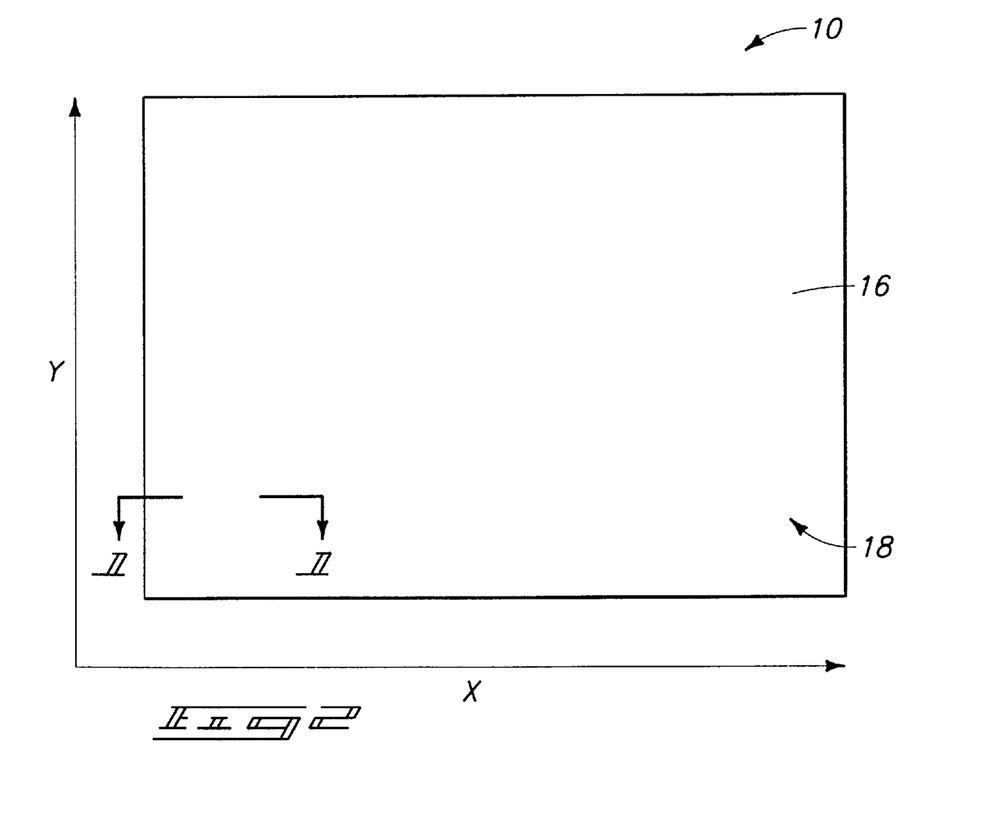
FIG. 2 is a diagrammatic top view of the substrate comprising the portion of FIG. 1.

FIG. 2 shows a top view of the radiation-patterning tool substrate 10 comprising the portion of FIG. 1. FIG. 2 also shows an "X" and "Y" axis system utilized herein for defining various portions of substrate 10 relative to one another. Substrate 10 has a top surface 18 defined by a surface of photoresist layer 16.

Figure 3:
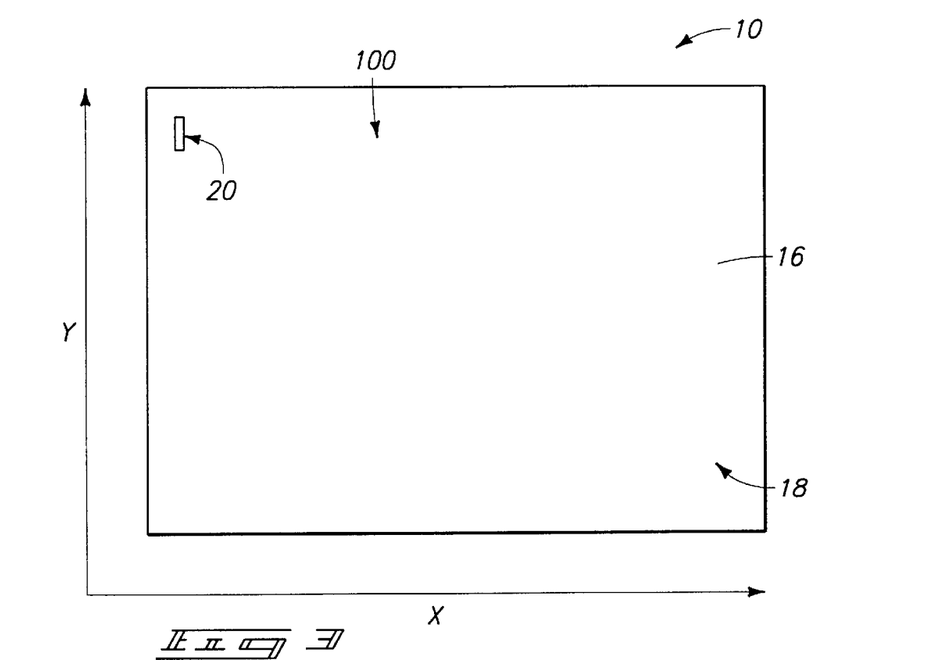
FIG. 3 is a view of the FIG. 2 substrate shown at a processing step subsequent to that of FIG. 2.

FIG. 3 shows substrate 10 after initial exposure of a portion of substrate 10 to radiation. Such exposure defines a region 20 of photoresist layer 16 which has been exposed to the radiation and another region 100 which has not been exposed to the radiation. In the shown embodiment, region 20 is a thin rectangle extending along axis "Y." Region 20 can be formed, by example, either e-beam or laser writing methodologies. The radiation utilized to form region 20 can be, for example, ultraviolet light, such as would be utilized in deep-UV methodologies. Alternatively, the radiation can be electron beam radiation. If photoresist 16 comprises a chemically amplified photoresist, the exposure of region 20 to radiation will cause release of a catalyst (typically acid) within region 20, and such catalyst will subsequently catalyze chemical reactions to change the solubility of region 20 in a solvent relative to the solubility of the non-exposed region 100.

Figure 4:
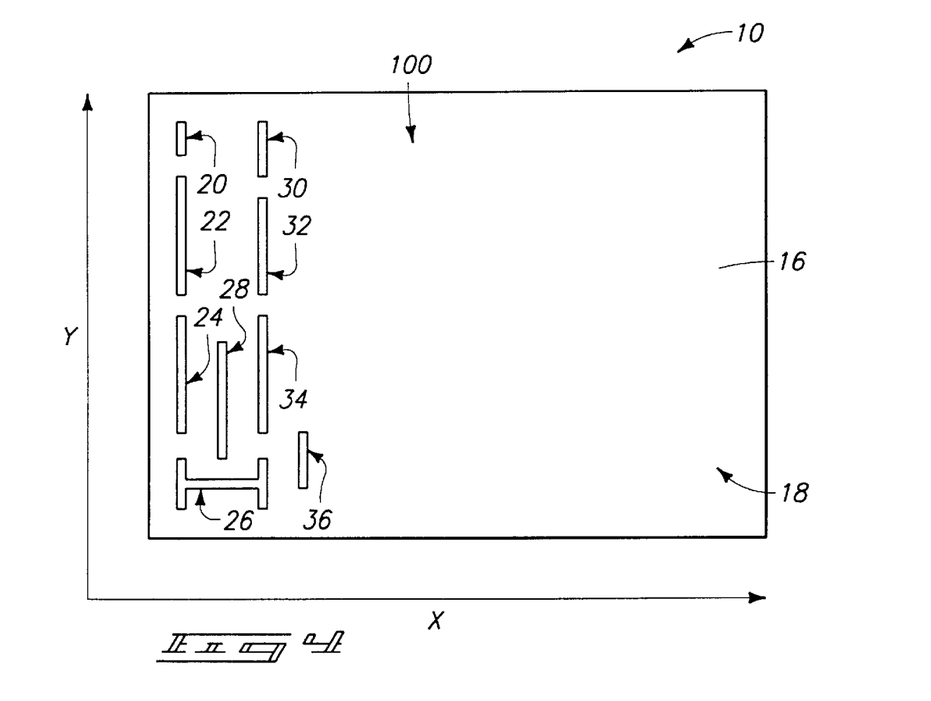
FIG. 4 is a view of the FIG. 2 substrate shown at a processing step subsequent to that of FIG. 3.

Referring to FIG. 4, substrate 10 is shown after continued exposure of photoresist 16 to radiation. The exposure forms exposed regions 22, 24, 26, 28, 30, 32, 34 and 36. The regions are numbered sequentially in an approximate order in which the regions are formed, assuming that a laser-writing or e-beam writing method is utilized and is rastered along the "Y" axis. It is noted that a region extending along the "X" axis, such as, for example, region 26, may have portions formed sequentially at different rastering intervals. Accordingly, a left-most portion of region 26 may be formed after region 24 and before region 28, whereas a right-most portion of region 26 may be formed after region 34 and before region 36. It may take several hours to complete the pattern shown in FIG. 4, and accordingly several hours may pass between the time that initial region 20 is exposed to radiation and subsequently-formed region 36 is exposed to radiation.

Figure 5:
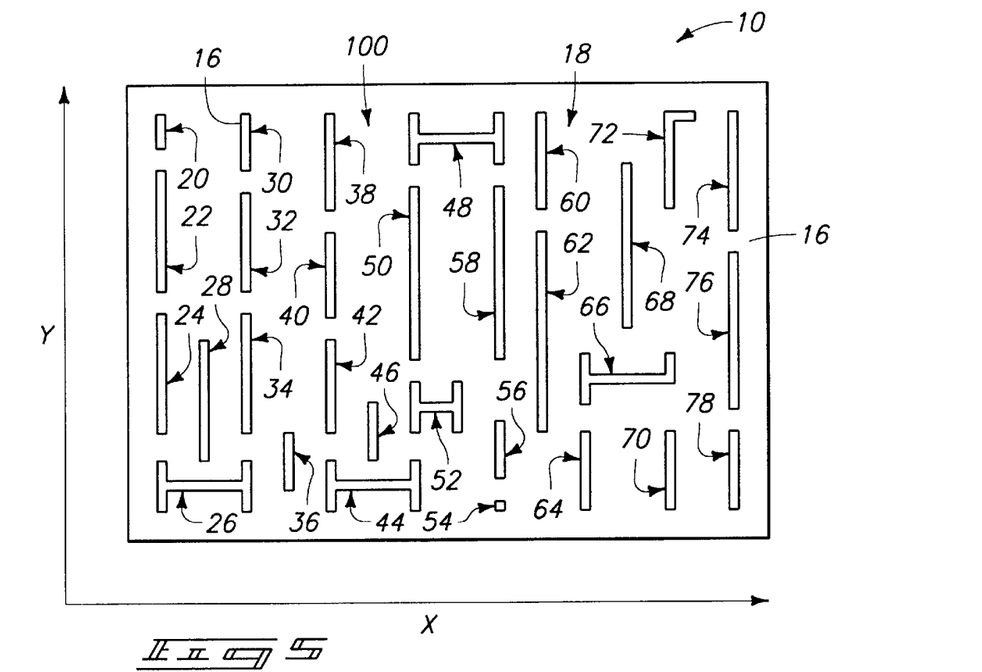
FIG. 5 is a view of the FIG. 2 substrate shown at a processing step subsequent to that of FIG. 4.

Referring to FIG. 5, substrate 10 is shown after further exposure of photoresist expanse 16 to radiation. Such exposure forms exposed regions 38, 40, 42, 44, 46, 48, 50, 52, 54, 56, 58, 60, 62, 64, 66, 68, 70, 72, 74, 76 and 78 of photoresist expanse 16 while leaving a remainder of region 100 unexposed to radiation. The exposed regions of photoresist 16 will ultimately have a different solubility in a developer solvent relative to the unexposed region 100. The shown unexposed photoresist region 100 is a common photoresist layer over an entirety of substrate 10, and further is continuous between the various exposed regions.

An earlier-exposed region can be referred to as a first region of expanse 16, and a later-exposed region as a second region of expanse 16, with unexposed region 100 being referred to as a third region of expanse 16. Accordingly, region 20 can be considered a first region of expanse 16, region 78 a second region of expanse 16, and region 100 a third region of expanse 16. Of course, numerous other combinations are possible, such as, for example, region 22 can be referred to as a first region of expanse 16, region 24 as a second region of expanse 16 and region 100 as a third region. Also, even though region 100 is referred to as an "unexposed" region, it is to be understood that the invention also encompasses embodiments wherein region 100 is exposed to radiation; but typically region 100 would be exposed to a different dose of radiation than the regions 20, 22, 24, 26, 28, 30, 32, 34, 36, 38, 40, 42, 44, 46, 48, 50, 52, 54, 56, 58, 60, 62, 64, 66, 68, 70, 72, 74, 76 and 78. Accordingly, region 100 can be radiated with a non-zero dose value, and frequently region 100 would be treated with a low dose of radiation. The reference to region 100 as an "unexposed" region can, in the context of this disclosure, mean that region 100 is not exposed to the radiation utilized for forming regions 20, 22, 24, 26, 28, 30, 32, 34, 36, 38, 40, 42, 44, 46, 48, 50, 52, 54, 56, 58, 60, 62, 64, 66, 68, 70, 72, 74, 76 and 78, rather than meaning that region 100 has not been exposed to any radiation.

As discussed in the "Background" section of this disclosure, a difficulty associated with prior art methods is that acid diffusion can occur relative to an earlier-exposed region (or first region) before and during exposure of a later-formed region (or second region) to radiation. For instance, acid diffusion can occur relative to earlier formed region 20 during an entirety of the time between exposure of region 20 to radiation and the final exposure of last-formed region 78 to radiation. In some applications, the time between exposure of region 20 to radiation and final exposure of region 78 to radiation can be 24 hours or more. Accordingly, substantial diffusion of acid can occur about region 20 while the rest of the pattern shown in FIG. 5 is being formed. Such can cause a minimum feature size of region 20 to be substantially wider than a minimum feature size of region 78.

The relative time differences between exposure of region 20 and exposure of later-formed regions can be at least about one hour, at least about three hours, at least about 10 hours, or at least about 24 hours, for example.

One aspect of the present invention is to expose region 20 to a different radiation than region 78 so that less acid is released during exposure of region 20 to radiation than is released during exposure of region 78 to radiation. For instance, both region 20 and region 78 can be exposed to ultraviolet light, but region 20 can be exposed to a lower dose of the ultraviolet light than is region 78. The term "lower dose" refers to a lower amount of ultraviolet light per unit area of region 20, which results in less acid being generated at region 20. Since the acid generated at region 20 has more time to diffuse, and accordingly more time to catalyze reactions with polymer at region 20 than does the acid released at region 78, less acid at region 20 can form a comparable minimum feature size as can a greater amount of acid released at region 78. The relative dosage between region 20 and later-formed regions can be determined through one or both of experimentation and theoretical calculation. The dosage difference may be a linear function of time difference between exposure of regions, a logarithmic difference, or related by some other mathematical correlation, depending on the type of radiation utilized, the type of resist utilized, and the tolerance for differences in minimum feature size between earlier-formed regions and later-formed regions. In particular aspects of present invention, different doses of radiation can be utilized in forming one or more of regions 20, 22, 24, 26, 28, 30, 32, 34, 36, 38, 40, 42, 44, 46, 48, 50, 52, 54, 56, 58, 60, 62, 64, 66, 68, 70, 72, 74, 76 and 78 relative to the doses of radiation utilized for forming others of the regions. The invention thus encompasses utilization of at least two doses of radiation for forming regions 20, 22, 24, 26, 28, 30, 32, 34, 36, 38, 40, 42, 44, 46, 48, 50, 52, 54, 56, 58, 60, 62, 64, 66, 68, 70, 72, 74, 76 and 78, and can encompass utilization of many more than two doses, with some applications utilizing a continuously varying dose.

In a preferred process of the present invention, a dosage difference between the radiation utilized for region 20 and that utilized for region 78 will be determined so that region 78 has a minimum feature size approximately equal to that of region 20. A minimum feature size of the shown region 20 can correspond to a width of the region along the "X" axis and a minimum feature size of the shown region 78 can correspond to a width of such region along the "X" axis.

Although the invention is described above with reference to a difference in dose being the difference between the radiation utilized for earlier-formed regions and that utilized for later-formed regions, it is to be understood that other differences in radiation can be used in addition to, or alternatively to, a difference in dose. For instance, the wavelength of radiation utilized for the earlier-formed regions can be shifted from an optimal wavelength to lower the efficiency of photocatalyzed reactions.

Figure 6:
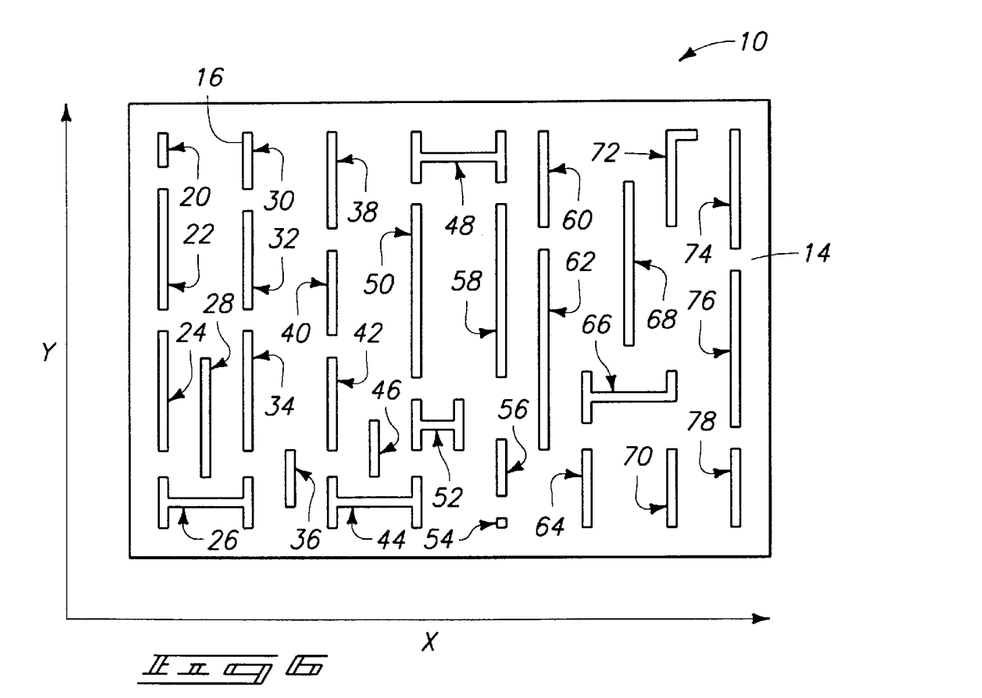
FIG. 6 is a view of the FIG. 2 substrate shown at a processing step subsequent to that of FIG. 5.

FIG. 6 illustrates substrate 10 after exposure to a developer solvent for an application in which resist 16 corresponds to a negative photoresist. Accordingly, the regions exposed to radiation are rendered insoluble in the developer solvent relative to the regions not exposed to the radiation. Photoresist 16 is thus patterned into a series of shapes corresponding to the exposed regions, and unexposed regions 100 (FIG. 5) are removed to leave a surface of chrome 14 between the patterned structures of photoresist 16.

Figure 7:
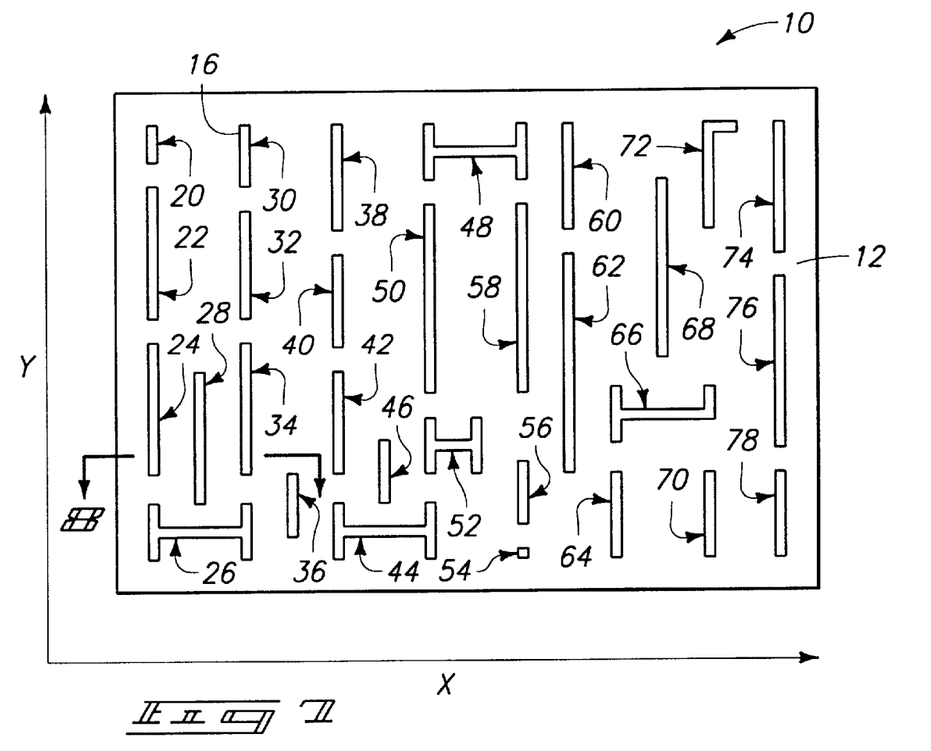
FIG. 7 is a view of the FIG. 2 substrate shown at a processing step subsequent to that of FIG. 6.
Figure 8:
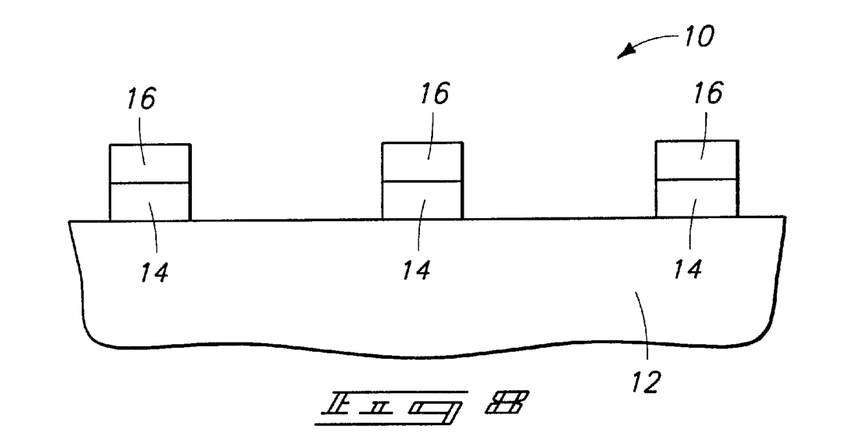
FIG. 8 is a diagrammatic, cross-sectional view of a portion of the radiation-patterning tool substrate of FIG. 7 shown along the line 8—8 of FIG. 7.

Referring to FIG. 7, a pattern can be transferred from the structures of photoresist 16 to underlying chrome layer 14 to remove chrome layer 14 from between structures 16 and accordingly leave an exposed surface of quartz plate 12 between the structures. FIG. 8 is a diagrammatic cross-sectional view of a region of the FIG. 7 structure illustrating the patterned chrome 14 beneath the patterned photoresist structures 16.

The embodiment of FIGS. 1–8 is but one embodiment of the present invention, and it is to be understood that the invention encompasses other embodiments wherein photoresist is patterned relative to substrates other than as shown in FIGS. 1–8. For instance, methodology of the present invention can be utilized for forming stencils. In such methodology, photoresist is formed over a substrate, and subsequently patterned. A pattern from the photoresist is then transferred entirely through the substrate to transform the substrate into a stencil. The substrate can comprise, for example, a semiconductive material, such as, for example, monocrystalline silicon, or can comprise other materials, such as, for example, glass.

Figure 9:
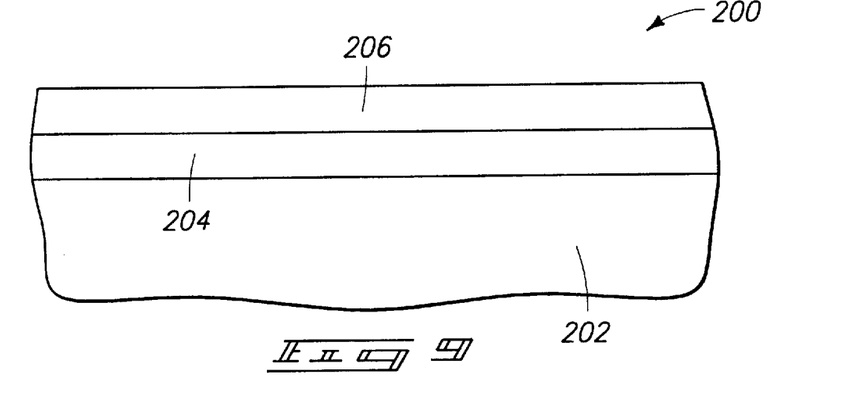
FIG. 9 is a diagrammatic, cross-sectional view of a semiconductor substrate shown at a preliminary step of a second method of the present invention.

In another embodiment of the invention, a first radiation is utilized during photolithographic patterning of photoresist over a first portion of a semiconductor substrate, and a second radiation is utilized during patterning of photoresist over a second portion of the substrate. Such aspect is described with reference to FIGS. 9–11. Referring initially to FIG. 9, a fragment of a semiconductor substrate 200 is illustrated. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate 200 comprises a base 202 which can comprise, for example, monocrystalline silicon. A material 204 is over base 202, and a photoresist expanse 206 is over material 204. Material 204 comprises a material which is ultimately to be patterned, and can comprise either a single layer or a stack of layers. Material 204 can comprise, for example, insulative materials, such as, for example, silicon dioxide or silicon nitride; and/or can comprise conductive materials, such as, for example, metals and/or metal silicides; and/or can comprise conductively-doped polycrystalline silicon or amorphous silicon. Photoresist 206 can comprise, for example, a chemically amplified photoresist.

Figure 10:
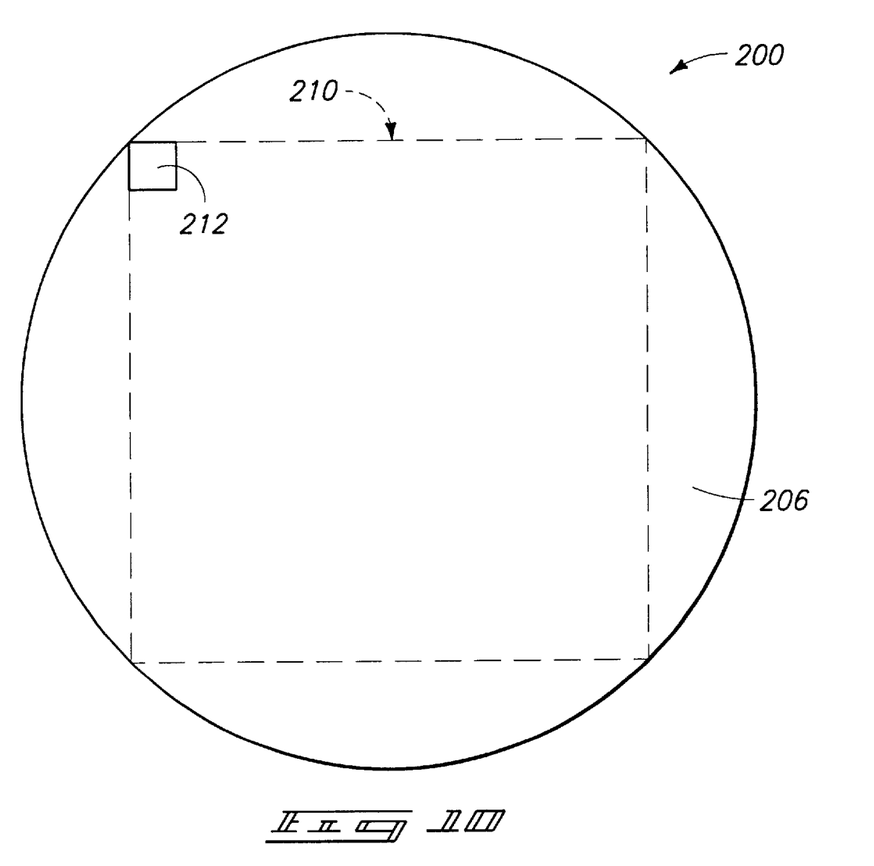
FIG. 10 is a top view of a semiconductor wafer comprising the fragment of FIG. 9, and shown at the preliminary processing step.

FIG. 10 shows a top view of a semiconductor wafer comprising the FIG. 9 fragment. The FIG. 9 fragment is not specifically identified in the FIG. 10 structure, but is to be understood that the FIG. 9 fragment can be situated anywhere within the FIG. 10 structure.

FIG. 10 shows a region 210 in dashed line which is ultimately to be a patterned region formed within photoresist 206. Region 210 is to be formed by stepping a reticle-generated pattern across the region 210. Specifically, the reticle-generated pattern forms a cell 212 (one of which is shown diagrammatically in the processing step of FIG. 10) and the patterning within region 210 is formed by stepping the reticle across region 210 to form a plurality of cells 212. The pattern within cell 212 would comprise regions exposed to light transmitted through the reticle, and regions not exposed to the transmitted light. Such exposed and unexposed regions are not illustrated in the diagrammatic view of FIG. 10.

The reticle-generated pattering can start in one corner of the patterned region 210 and proceed across region 210 to ultimately finish in an opposing corner. A time difference between when the reticle-generated pattering starts in a first corner and when it ends up in a second corner can be large enough to have catalyst diffusion within a chemically amplified photoresist. Accordingly, it can be desired to utilize a different radiation at an initially formed portion of the patterned region relative to that utilized at a subsequently formed portion.

Figure 11:
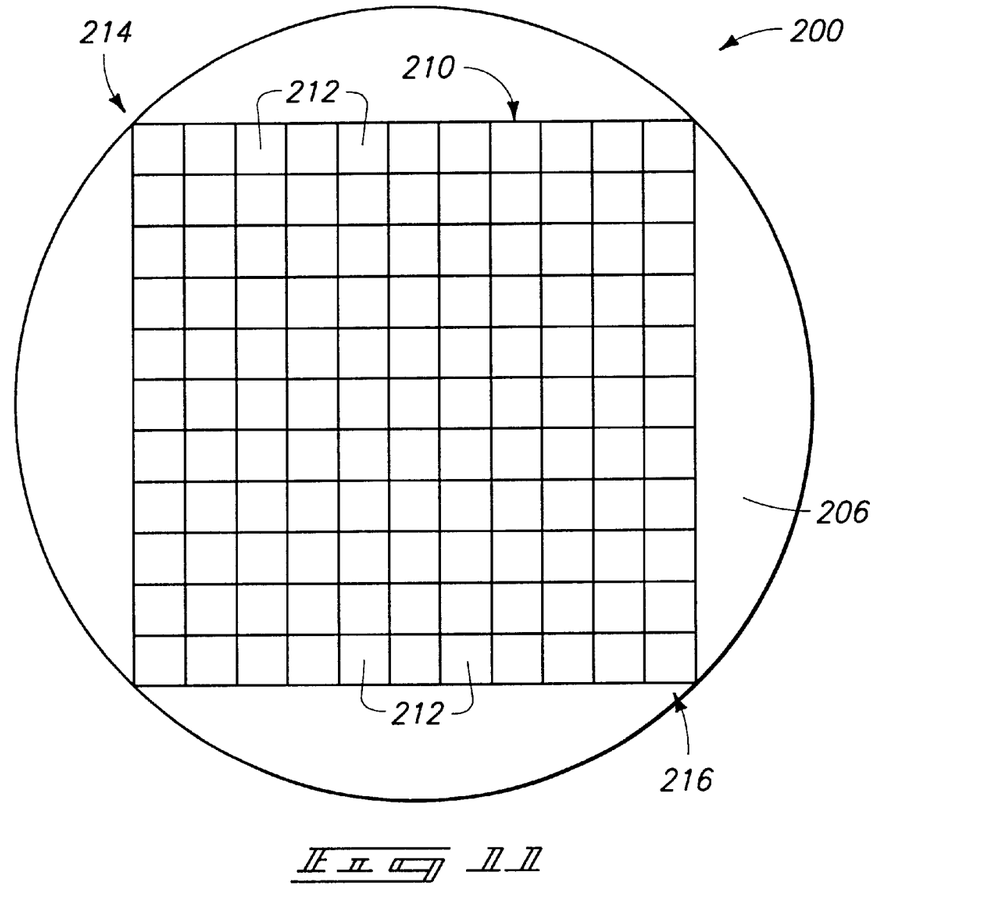
FIG. 11 is a view of the FIG. 10 wafer shown at a processing step subsequent to that of FIG. 10.

FIG. 11 illustrates wafer 200 after reticle-generated pattern 212 is stepped across an entirety of the patterned region 210, with only some of the reticle-generated unit cells 212 being labeled. The pattern formed by repeating unit cells 212 can comprise an initially formed region 214 at one corner, and a lastly-formed region 216 at another corner. The radiation can be adjusted so that the amount of catalyst diffusion at initially formed region 214 is about the same as that formed at lastly-formed region 216, so that comparable minimum feature widths exist in both regions 214 and 216, as well as in intermediately-formed regions between regions 214 and 216. The radiation can be adjusted by, for example, adjusting a dose and/or a wavelength of the radiation from the time that the initially-formed region 214 is generated and the time that lastly-formed region 216 is generated. The radiation can be adjusted continuously, or discretely between the time that initially-formed region 214 is generated and the time that lastly-formed region 216 is generated.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a pattern across an expanse of photoresist, comprising:
    defining a first region of the expanse, a second region of the expanse, and a third region of the expanse;
    exposing the first region of the expanse to a first radiation while leaving the third region of the expanse not exposed to the first radiation;
    after exposing the first region of the expanse to the first radiation, exposing the second region of the expanse to a second radiation while leaving the third region of the expanse not exposed to the second radiation, the second radiation being different from the first radiation;
    wherein the exposure of the first and second regions of the expanse to the first and second radiations alters the solubility of the first and second regions in a solvent relative to the solubility of the third region of the expanse;
    after exposing the first and second regions of the expanse to the first and second radiations, exposing the expanse to the solvent to pattern the expanse;
    wherein the photoresist is chemical amplification resist;
    wherein the first region includes a first feature formed in the patterned expanse of photoresist to a first width;
    wherein the second region includes a second feature formed in the patterned expanse of photoresist to a second width; and
    wherein the difference between the first and second radiation causes the second width to be formed more similar to the first width than it would be if the first and second radiations were not different from one another.

2. The method of claim 1 wherein the second region is exposed to the second radiation at least 1 hour after the first region is exposed to the first radiation.

3. The method of claim 1 wherein the second region is exposed to the second radiation at least 3 hours after the first region is exposed to the first radiation.

4. The method of claim 1 wherein the second region is exposed to the second radiation at least 10 hours after the first region is exposed to the first radiation.

5. The method of claim 1 wherein the second region is exposed to the second radiation at least 24 hours after the first region is exposed to the first radiation.

6. The method of claim 1 wherein the first and second radiations are both light, and wherein the difference between the first and second radiations includes a difference in the wavelength of the first radiation light relative to the second radiation light.

7. The method of claim 1 wherein the first and second radiations are both ultraviolet light of the same wavelength, with the second radiation comprising a different dose of the ultraviolet light than the first radiation.

8. The method of claim 1 wherein the first and second radiations are part of a continuing change in radiation occurring during the patterning of the expanse of photoresist; and wherein the change is linear over time.

9. The method of claim 1 wherein the first and second radiations are part of a continuing change in radiation occurring during the patterning of the expanse of photoresist; and wherein the change is non-linear over time.

10. A method of forming a pattern across an expanse of photoresist, comprising:
    defining a first region of the expanse, a second region of the expanse, and a third region of the expanse;
    exposing the first region of the expanse to a first radiation while leaving the third region of the expanse not exposed to the first radiation;
    after exposing the first region of the expanse to the first radiation, exposing the second region of the expanse to a second radiation while leaving the third region of the expanse not exposed to the second radiation, the second radiation being different from the first radiation;
    wherein the exposure of the first and second regions of the expanse to the first and second radiations alters the solubility of the first and second regions in a solvent relative to the solubility of the third region of the expanse;
    after exposing the first and second regions of the expanse to the first and second radiations, exposing the expanse to the solvent to pattern the expanse;
    wherein the photoresist is chemical amplification resist;
    wherein the first region includes a first feature formed in the patterned expanse of photoresist to a first minimum feature size;
    wherein the second region includes a second feature formed in the patterned expanse of photoresist to a second minimum feature size; and
    wherein the difference between the first and second radiation causes the second minimum feature size to be more similar to the first minimum feature size than it would be if the first and second radiations were not different from one another.

11. The method of claim 10 wherein the second region is exposed to the second radiation at least 1 hour after the first region is exposed to the first radiation.

12. The method of claim 10 wherein the second region is exposed to the second radiation at least 3 hours after the first region is exposed to the first radiation.

13. The method of claim 10 wherein the second region is exposed to the second radiation at least 10 hours after the first region is exposed to the first radiation.

14. The method of claim 10 wherein the second region is exposed to the second radiation at least 24 hours after the first region is exposed to the first radiation.

15. The method of claim 10 wherein the first and second radiations are part of a continuing change in radiation occurring during the patterning of the expanse of photoresist; and wherein the change is linear over time.

16. The method of claim 10 wherein the first and second radiations are part of a continuing change in radiation occurring during the patterning of the expanse of photoresist; and wherein the change is non-linear over time.

17. A method of forming a pattern across an expanse of photoresist, comprising:
    defining a first region of the expanse, a second region of the expanse, and a third region of the expanse;
    exposing the first region of the expanse to a first dose of radiation while leaving the third region of the expanse not exposed to the first dose of the radiation;
    after exposing the first region of the expanse to the first dose of the radiation, exposing the second region of the expanse to a second dose of the radiation while leaving the third region of the expanse not exposed to the second dose of the radiation; the second dose being different from the first dose;
    wherein the exposure of the first and second regions of the expanse to the radiation alters the solubility of the first and second regions in a solvent relative to the solubility of the third region of the expanse in the solvent;
    after exposing the first and second regions of the expanse to the radiation, exposing the expanse to the solvent to pattern the expanse;
    wherein the photoresist is chemical amplification resist;
    wherein the first region includes a first feature formed in the patterned expanse of photoresist to a first width;
    wherein the second region includes a second feature formed in the patterned expanse of photoresist to a second width; and
    wherein the difference between the first and second doses causes the second width to be more similar to the first width than it would be if the first and second doses were not different from one another.

18. The method of claim 17 wherein the second region is exposed to the second dose at least 1 hour after the first region is exposed to the first dose.

19. The method of claim 17 wherein the second region is exposed to the second dose at least 3 hours after the first region is exposed to the first dose.

20. The method of claim 17 wherein the second region is exposed to the second dose at least 10 hours after the first region is exposed to the first dose.

21. The method of claim 17 wherein the second region is exposed to the second dose at least 24 hours after the first region is exposed to the first dose.

22. A method of forming a pattern across an expanse of photoresist, comprising:
    defining a first region of the expanse, a second region of the expanse, and a third region of the expanse;
    exposing the first region of the expanse to a first dose of radiation while leaving the third region of the expanse not exposed to the first dose of the radiation;
    after exposing the first region of the expanse to the first dose of the radiation, exposing the second region of the expanse to a second dose of the radiation while leaving the third region of the expanse not exposed to the second dose of the radiation; the second dose being different from the first dose;
    wherein the exposure of the first and second regions of the expanse to the radiation alters the solubility of the first and second regions in a solvent relative to the solubility of the third region of the expanse in the solvent;
    after exposing the first and second regions of the expanse to the radiation, exposing the expanse to the solvent to pattern the expanse;

wherein the photoresist is chemical amplification resist;

wherein the first region includes a first feature formed in the patterned expanse of photoresist to a first minimum feature size;

wherein the second region includes a second feature formed in the patterned expanse of photoresist to a second minimum feature size; and wherein the difference between the first and second doses causes the second minimum feature size to be more similar to the first minimum feature size than it would be if the first and second doses were not different from one another.

23. A method of forming a pattern across an expanse of chemical amplification photoresist, comprising:

sequentially exposing regions of the expanse to radiation while not exposing other regions of the expanse to the radiation; the radiation changing in dose over a time of the exposure of the regions so that a region exposed early to the radiation is exposed to a different dose than a region exposed later to the radiation; the exposed regions of the expanse having an altered solubility in a solvent relative to the non-exposed regions of the expanse;

after exposing the regions of the expanse to the radiation, exposing the expanse to the solvent to pattern the expanse; and wherein the change in the dose of the radiation causes a minimum feature dimension of the region exposed earlier to the radiation to be more similar to a minimum feature dimension of the region exposed later to the radiation than it would be if the radiation dose did not change over time.

24. The method of claim 23 wherein the radiation dose changes linearly over the time of the exposing.

25. The method of claim 23 wherein the radiation dose changes nonlinearly over the time of the exposing.

26. The method of claim 23 wherein the radiation dose changes continuously over the time of the exposing.

* * * * *